(12) United States Patent
Luo et al.

(10) Patent No.: US 11,868,055 B2
(45) Date of Patent: Jan. 9, 2024

(54) MULTIFUNCTIONAL LITHOGRAPHY DEVICE

(71) Applicant: The Institute of Optics and Electronics, The Chinese Academy of Sciences, Sichuan (CN)

(72) Inventors: Xiangang Luo, Sichuan (CN); Xiaoliang Ma, Sichuan (CN); Mingbo Pu, Sichuan (CN); Ping Gao, Sichuan (CN); Xiong Li, Sichuan (CN)

(73) Assignee: The Institute of Optics and Electronics, The Chinese Academy of Sciences, Chengdu (CN)

( * ) Notice: Subject to any disclaimer, the term of this patent is extended or adjusted under 35 U.S.C. 154(b) by 191 days.

(21) Appl. No.: 17/997,503

(22) PCT Filed: Apr. 28, 2021

(86) PCT No.: PCT/CN2021/090681
§ 371 (c)(1),
(2) Date: Oct. 28, 2022

(87) PCT Pub. No.: WO2021/219028
PCT Pub. Date: Nov. 4, 2021

(65) Prior Publication Data
US 2023/0129163 A1 Apr. 27, 2023

(30) Foreign Application Priority Data
Apr. 29, 2020 (CN) .......................... 202010354566.X

(51) Int. Cl.
*G03F 7/00* (2006.01)
*G03F 7/20* (2006.01)

(52) U.S. Cl.
CPC ........ *G03F 7/70775* (2013.01); *G03F 7/2004* (2013.01); *G03F 7/70258* (2013.01); *G03F 7/70716* (2013.01)

(58) Field of Classification Search
CPC .............. G03F 7/70775; G03F 7/2004; G03F 7/70258; G03F 7/70716
See application file for complete search history.

(56) References Cited

U.S. PATENT DOCUMENTS

| 6,144,719 | A | 11/2000 | Hasegawa et al. |
| 8,284,380 | B2* | 10/2012 | Zhu ...................... G03F 7/70725 310/12.05 |
| 10,725,389 | B2* | 7/2020 | Aoki ....................... F16C 39/06 |

FOREIGN PATENT DOCUMENTS

| CN | 101063810 A | 10/2007 |
| CN | 101206410 A | 6/2008 |

(Continued)

OTHER PUBLICATIONS

"International Application Serial No. PCT/CN2021/090681, International Search Report dated Jul. 14, 2021", w/ English Translation, (Jul. 14, 2021), 8 pgs.

(Continued)

*Primary Examiner* — Hung V Nguyen
(74) *Attorney, Agent, or Firm* — Schwegman Lundberg & Woessner, P.A.

(57) ABSTRACT

Provided is a multifunctional lithography device, including: a vacuum substrate-carrying stage configured to place a substrate and adsorb the substrate on the vacuum substrate-carrying stage by controlling an airflow, so as to control a gap between the substrate and the mask plate; a mask frame arranged above the vacuum substrate-carrying stage and configured to fix the mask plate; a substrate-carrying stage motion system arranged below the vacuum substrate-carrying stage and configured to adjust a position of the vacuum (Continued)

substrate-carrying stage, so that a distance between the substrate and the mask plate satisfies a preset condition; an ultraviolet light source system arranged above the mask plate and configured to generate an ultraviolet light for lithography; and a three-axis alignment optical path system configured to align the ultraviolet light with the mask plate.

14 Claims, 8 Drawing Sheets

(56) References Cited

FOREIGN PATENT DOCUMENTS

| | | |
|---|---|---|
| CN | 111025855 A | 4/2020 |
| CN | 111352312 A | 6/2020 |

OTHER PUBLICATIONS

"International Application Serial No. PCT/CN2021/090681, Written Opinion dated Jul. 14, 2021", w/ English Translation, (Jul. 14, 2021), 11 pgs.

* cited by examiner

MULTIFUNCTIONAL LITHOGRAPHY DEVICE

CROSS REFERENCE TO RELATED APPLICATIONS

This application is a U.S. National Stage Filing under 35 U.S.C. § 371 from International Application No. PCT/CN2021/090681, filed on Apr. 28, 2021, and published as WO2021/219028 on Nov. 4, 2021, which claims priority to Chinese Patent Application No. 202010354566.X filed on Apr. 29, 2020; the benefit of priority of each of which is hereby claimed herein, and which applications and publication are hereby incorporated herein by reference in their entirety.

TECHNICAL FIELD

The present disclosure relates to a field of optical micro-nano manufacturing equipment technology, and in particular, to a multifunctional lithography device.

BACKGROUND

At present, the lithography technology mainly includes the following lithography modes: first, a contact mode, in which a mask plate is directly contacted with and exposed to a silicon wafer coated with a photoresist, and which has the characteristics of high resolution, simple equipment, convenient operation and low cost; second, a proximity mode, in which a detection system to measure a gap between the mask plate and the photoresist is added compared with the contact mode, and an exposure through a certain gap may avoid the defects such as damage and contamination of the mask plate and the photoresist due to a direct contact between the two; third, a Talbot lithography mode, in which a Z-direction motion positioning system with a high precision and stability is configured to achieve a fixed-point exposure and scanning exposure, and photolithography is performed using a periodic object self-imaging generated by a Talbot effect; and fourth, an SP lithography mode, in which using of the short wavelength characteristics of SP may effectively resonantly couple with evanescent waves localized on a surface of an object to achieve amplification and transmission of the evanescent waves, resonance interference and local enhancement, such that patterns exceeding a diffraction limit of traditional lithography are obtained, and precise leveling and gap control technologies are configured in aspect of device.

Under the background of the development of lithography technology and the continuous diversification of application requirements, the use of a single lithography mode may not meet the requirements for preparing micro-nano structure patterns, and may also cause problems such as low utilization rate of a device of a single lithography mode.

SUMMARY

In order to solve the above problem, there is provided a multifunctional lithography device according to the present disclosure, including: a vacuum substrate-carrying stage 12, wherein the vacuum substrate-carrying stage 12 is configured to place a substrate 32, adsorb the substrate 32 on the vacuum substrate-carrying stage 12 by controlling an airflow, and provide a vacuum environment for the substrate 32 and a mask plate 31, so as to control a gap between the substrate 32 and the mask plate 31; a mask frame 4 arranged above the vacuum substrate-carrying stage 12 and configured to fix the mask plate 31; a substrate-carrying stage motion system arranged below the vacuum substrate-carrying stage 12 and configured to adjust a position of the vacuum substrate-carrying stage 12, so that a distance between the substrate 32 and the mask plate 31 satisfies a preset condition; an ultraviolet light source system 6 arranged above the mask plate 31 and configured to generate an ultraviolet light for lithography; and a three-axis alignment optical path system 5 configured to align the ultraviolet light with the mask plate 31.

According to the embodiments of the present disclosure, the substrate-carrying stage motion system includes: an XY-direction macro motion system 2 configured to adjust displacements of the vacuum substrate-carrying stage 12 in an X-axis direction and a Y-axis direction; a Z-direction macro-micro three-point leveling system 3 arranged on the XY-direction macro motion system 2, and configured to implement a coarse adjustment and a fine adjustment of a displacement of the vacuum substrate-carrying stage 12 in a Z-axis direction.

According to the embodiments of the present disclosure, the XY-direction macro motion system 2 includes: a motion base plate 20; a first linear guide rail 21-1 arranged on the motion base plate 20 and having a direction of a Y-axis direction; a Y-direction motion plate 22 arranged on the first linear guide rail 21-1; a second linear guide rail 21-2 arranged on the Y-direction motion plate 22 and having a direction of an X-axis direction perpendicular to the Y-axis direction; an X-direction motion plate 23 arranged on the second linear guide rail 21-2; a first linear actuator 15-1 arranged on the motion base plate 20, and configured to move the Y-direction motion plate 22 along the first linear guide rail 21-1; and a second linear actuator 15-2 arranged on the Y-direction motion plate 22, and configured to move the X-direction motion plate 23 along the second linear guide rail 21-2.

According to the embodiments of the present disclosure, the Z-direction macro-micro three-point leveling system 3 is arranged on the X-direction motion plate 23, and includes: a coarse displacement closed-loop system and an angular displacement mechanism, wherein the coarse displacement closed-loop system acts on the angular displacement mechanism, so that the vacuum substrate-carrying stage is displaced in the Z-axis direction, and the coarse displacement closed-loop system includes: a Z-direction coarse displacement rotary motor configured to adjust a displacement of the vacuum substrate-carrying stage in the Z-axis direction perpendicular to the X-axis direction and the Y-axis direction, wherein the coarse displacement closed-loop system feeds back and controls an operation of the Z-direction coarse displacement rotary motor according to a Z-direction displacement actually generated by the angular displacement mechanism; a linear guide rail anti-deviation mechanism configured to ensure that the Z-direction coarse displacement rotary motor only outputs a Z-direction displacement; and a three-point incremental grating ruler 16 configured to read a Z-direction displacement actually generated by the Z-direction coarse displacement rotary motor.

According to the embodiments of the present disclosure, the Z-direction macro-micro three-point leveling system 3 further includes: a three-point Z-direction fine displacement mechanism 11 arranged on the angular displacement mechanism 9 and configured to level the vacuum substrate-carrying stage 12, adjust an angle of the vacuum substrate-carrying stage 12 in a plane where an X-axis and a Y-axis are located, and implement a fine adjustment of the distance between the substrate 32 on the vacuum substrate-carrying stage 12 and the mask plate 31.

According to the embodiments of the present disclosure, the three-point Z-direction fine displacement mechanism 11 includes: a mechanism bottom plate, wherein a flange plate 18-1 is arranged in a middle portion of the mechanism bottom plate; a plurality of piezoelectric ceramic motor assemblies 19 evenly distributed on the mechanism bottom plate and configured to micro-adjust an inclination angle of the vacuum substrate-carrying stage 12 in the Z-axis direction, level the vacuum substrate-carrying stage 12, and implement the fine adjustment of the distance between the substrate 32 on the vacuum substrate-carrying stage 12 and the mask plate 31; a universal ball support 26 arranged above the mechanism bottom plate and connected with the piezoelectric ceramic motor assembly 19; at least one extension spring 30 connecting the mechanism bottom plate and a plate member on which the universal ball support 26 is arranged, and configured to drive the plate member to move downwards along the Z-axis when the piezoelectric ceramic motor assembly 19 is reset; an elastic reed 27 arranged above the universal ball support 26 and connected with the plurality of piezoelectric ceramic motor assemblies 19; a flange adapter 28 arranged on the elastic reed 27, connected with the flange plate 18-1 through the elastic reed and a circular hole in the plate member, and configured to adjust the angle of the vacuum substrate-carrying stage 12 in the plane where the X-axis and the Y-axis are located based on a driving of the flange plate 18-1; and a substrate-carrying stage support surface 29, wherein a center of the substrate-carrying stage support surface 29 is connected with the flange adapter 28 and connected with the elastic reed 27 through the flange adapter 28, and the substrate-carrying stage support surface 29 is configured to place the vacuum substrate-carrying stage 12.

According to the embodiments of the present disclosure, the angular displacement mechanism 9 includes: a crossed roller bearing 18-2 arranged on a plane of the angular displacement mechanism 9, connected with the flange plate 18-1, and configured to drive the flange plate 18-1; and an angular displacement linear motor 10 configured to drive the crossed roller bearing 18-2.

According to the embodiments of the present disclosure, a compression spring is supported below the angular displacement mechanism.

According to the embodiments of the present disclosure, the device further includes: a passive vibration isolation system 1 including a marble platform and vibration isolation legs distributed at four corners of the marble platform; wherein the substrate-carrying stage motion system is placed on the passive vibration isolation system 1.

According to the embodiments of the present disclosure, the three-axis alignment optical path system 5 includes: a dual telephoto objective lens mounted on a three-axis symmetrical displacement system; the three-axis symmetrical displacement system configured to displace the dual telephoto objective lens along the X-axis, Y-axis, Z-axis direction; and a CCD camera configured to photograph the substrate 32 and the mask plate 31, and transmit an imaging to a computer, so as to allow the computer to judge whether the mask plate 31 and the substrate 32 are aligned.

According to another aspect of the present disclosure, there is provided a multifunctional lithography device, including: a passive vibration isolation system 1, an XY-direction macro-motion system 2, a Z-direction macro-micro three-point leveling system 3, a mask frame 4, a three-axis alignment optical path system 5, an ultraviolet light source system 6, a control system 7, a coarse displacement closed-loop system 8, an angular displacement mechanism 9, an angular displacement linear motor 10, a three-point Z-direction fine displacement mechanism 11, a vacuum substrate-carrying stage mechanism 12, a linear guide rail anti-deviation mechanism 13, a Z-direction coarse displacement rotary motor 14, a first linear actuator 15-1, a second linear actuator 15-2, a three-point incremental grating ruler 16, a compression spring 17, a crossed roller bearing 18, piezoelectric ceramic motor assembly 19, a motion base plate 20, a first linear guide rail 21-1, a second linear guide rail 21-2, a Y-direction motion plate 22, an X-direction motion plate 23, piezoelectric motor mounting accessories 24, a piezoelectric motor 25, a universal ball support 26, an elastic read 27, a flange adapter 28, a substrate-carrying stage support surface 29 and an extension spring 30; wherein the passive vibration isolation system 1 includes 4 evenly and symmetrically arranged vibration isolation legs and a marble platform having a thickness of 200 mm, a bottom layer of the XY-direction macro-motion system 2 is the motion base plate 20 arranged on the passive vibration isolation system 1, the first linear guide rail 21-1 is arranged on a mounting plane of the motion base plate 20 to carry the Y-direction motion plate 22, so that the Y-direction motion plate 22 is pushed by the first linear actuator 15-1 to implement a Y-direction macro displacement, the second linear guide rail 21-2 is mounted on a mounting plane of the Y-direction motion plate 22 to carry the X-direction motion plate 23, so that the X-direction motion plate 23 is pushed by the second linear actuator 15-2 arranged on the Y-direction motion plate 22 to implement an X-direction macro displacement, the Z-direction macro-micro three-point leveling system 3 implements placing a substrate on the substrate-carrying stage and aligning marks of the substrate and a mask plate, and includes the coarse displacement closed-loop system 8 arranged on the XY-direction macro motion system 2, the linear guide rail anti-deflection mechanism 13 ensures that the Z-direction coarse displacement rotary motor 14 only output a Z-direction displacement on a rotary cam, the three-point incremental grating ruler 16 reads an actual Z-direction motion displacement to achieve a closed-loop control to the coarse displacement rotary motor 14, the compression spring 17 reduces a Z-direction static load of the Z-direction coarse displacement rotary motor 14 through the angle displacement mechanism 9 supported by the compression spring, the angular displacement linear motor 10 pushes the three-point Z-direction fine displacement mechanism 11 to move as a whole, the crossed roller bearing 18-2 is configured as a rotating support structure to implement an overall angular displacement motion of the three-point Z-direction fine displacement mechanism 11, the piezoelectric ceramic motor assembly 19 is constituted by the piezoelectric motor mounting accessory 24 and the piezoelectric motor 25, and mounted on the three-point Z-direction fine displacement mechanism 11 as a whole, the piezoelectric motor 25 is mounted on the universal ball support 26 through a ball connection, upper and lower connection plates of the piezoelectric motor 25 achieve a micro force return of the piezoelectric motor 25 using the extension spring 30, the elastic reed 27 is fixedly connected with the piezoelectric motor 25, a central flange is connected to a lower plane of the substrate-carrying stage support surface 29, so that an entire vacuum substrate-carrying stage mechanism 12 is evenly rebounded; the vacuum substrate-carrying stage mechanism 12 completes an adsorption and an air blow for the substrate in a multi-hole manner, the mask frame 4 fixes the mask plate using three manual knobs in a pulling type fixing and mask clamping manner, the three-axis alignment optical path system 5 includes a three-axis symmetrical displacement system, a telephoto objective lens, a CCD camera and an overall optical path system, a dual telephoto objective lens is mounted in the three-axis symmetrical displacement system to implement an XYZ direction displacement of an alignment objective lens, and is imaged to a PC end by the CCD camera to judge an alignment of marks of the mask plate and the substrate, the ultraviolet light source system 6 includes a complete set of optical path system, and positions an exposure location in a closed-loop manner by a Y-direction displacement and extension using a 365 nm light source, so as to achieve a substrate exposure effect, and a control system 7 is configured to control the device.

According to the embodiments of the present disclosure, the passive vibration isolation system 1, the XY-direction macro-motion system 2, the Z-direction macro-micro three-point leveling system 3, the mask frame 4, the three-axis alignment optical path system 5, the ultraviolet light source system 6, and the control system 7 constitute an integral device, the device control system 7 of the integral device is also arranged together with the integral device, exposure functions includes four exposure modes: a contact mode, a proximity mode, a Talbot lithography mode, and an SP lithography mode; and the control system 7 includes all circuit systems of the device: a PLC, a power supply, a driver, a switch, and a cable arrangement, so that the device is optimized as a whole.

According to the embodiments of the present disclosure, a stator of the first linear actuator 15-1 is mounted on the motion base plate 20, and a mover is mounted on the Y-direction motion plate 22, so as to implement a Y-direction motion of the Y-direction motion plate 22 through a low friction guide of the first linear guide rail 21-1, and in a same manner, a stator of the second linear actuator 15-2 is mounted on the Y-direction motion plate 22, and a mover is mounted on the X-direction motion plate 23, so as to implement an X-direction motion of the X-direction motion plate 23 through the second linear guide rail 21-1.

According to the embodiments of the present disclosure, the substrate-carrying stage motion system includes the XY-direction macro-motion system 2 and the Z-direction macro-micro three-point leveling system 3, and completes an XY-direction displacement using a construction of the first linear actuator 15-1 and the second linear actuator 15-2 with the first linear guide rail 21-1 and the second linear guide rail 21-2, the coarse displacement closed-loop system 8 is placed on a grinding surface of the upper surface of the XY-direction macro-motion system 2, and implements a coarse leveling of the substrate-carrying stage using a three-point design solution, the coarse displacement closed-loop system 8 and the angular displacement mechanism 9 enable the three-point Z-direction fine displacement mechanism 11 to have a great micro adjustment performance, and the vacuum substrate-carrying stage mechanism 12 is arranged on a topmost layer and integrates a summation of all motions to achieve a four-axis macro-micro-leveling and alignment function.

According to the embodiments of the present disclosure, the coarse displacement closed-loop system 8 includes the linear guide rail anti-deviation mechanism 13, the Z-direction coarse displacement rotary motor 14, the three-point incremental grating ruler 16, the compression spring 17, and a cam mounting assembly, the cam is driven to move by a rotation of the Z-direction coarse displacement rotary motor 14, an uneven rotation of the cam causes a change in a plane height of the angular displacement mechanism 9, the linear guide rail anti-deviation mechanism 13 prevents the mechanism from being damaged due to an excessively large difference in a three-point lifting height, Z-direction height differences of the motor are respectively recorded by the three-point incremental grating ruler 16, so as to control and adjust a level of the angular displacement mechanism 9, the cam of the linear guide rail anti-deviation mechanism 13 enters a descending process, and the compression spring bears an overall weight to avoid a fatigue damage of the cam.

According to the embodiments of the present disclosure, in the angular displacement mechanism 9, a stator of an angular displacement linear motor 10 is fixed on an outer ring mounting plate of the crossed roller bearing 18-2, and a mover is fixed on the three-point Z-direction fine displacement mechanism 11, the three-point Z-direction fine displacement mechanism 11 is connected with an inner ring of the crossed roller bearing 18-2 by a screw, the three-point Z-direction fine displacement mechanism 11 is driven by the angular displacement linear motor 10 to implement a small angle rotation with a center of the crossed roller bearing 18 as a rotation axis, and the vacuum substrate-carrying stage mechanism 12 may perform an XYθ displacement and a Z-direction coarse and fine displacement adjustment and leveling.

According to the embodiments of the present disclosure, the piezoelectric motor mounting accessories 24 fix the piezoelectric motor 25, a top of the piezoelectric motor 25 is connected to the universal ball support 26 by the universal ball, an elastic contraction of a fine displacement portion is achieved by the elastic reed 27, and the elastic reed 27 is connected with a center of the substrate-carrying stage support surface 29 through the flange adapter 28, so as to achieve a stable Z-direction fine displacement motion of the vacuum substrate-carrying stage mechanism 12.

DESCRIPTION OF THE REFERENCE SIGNS

1—passive vibration isolation system; 2—XY-direction macro motion system; 3—Z-direction macro-micro three-point leveling system; 4—mask frame; 5—three-axis alignment optical path system; 6—ultraviolet light source system; 7—control system; 8—coarse displacement closed-loop system; 9—angular displacement mechanism; 10—angular displacement linear motor; 11—three-point Z-direction fine displacement mechanism; 12—vacuum substrate-carrying stage; 13—linear guide rail anti-deviation mechanism; 14—Z-direction coarse displacement rotary motor; 15-1—first linear actuator; 15-2—second linear actuator; 16—three-point incremental grating ruler; 17—compression spring; 18-1—flange plate; 18-2—crossed roller bearing; 19—piezoelectric ceramic motor assemblies; 20—motion base plate; 21-1—first linear guide rail; 21-2—second linear guide rail; 22—Y-direction motion plate; 23—X-direction motion plate; 24—piezoelectric motor mounting accessories; 25—piezoelectric motor; 26—universal ball support; 27—elastic reed; 28—flange adapter; 29—substrate-carrying stage support surface; 30—extension spring; 31—mask plate; 32—substrate; 33—photoresist; 34—metal.

DETAILED DESCRIPTION OF EMBODIMENTS

Hereinafter, the embodiments of the present disclosure will be described with reference to the accompanying drawings. However, it should be understood that these descriptions are only exemplary, and are not intended to limit the scope of the present disclosure. In the following detailed description, for convenience of explanation, numerous specific details are set forth in order to provide a thorough understanding to the embodiments of the present disclosure. However, it is apparent that one or more embodiments may also be implemented without these specific details. Additionally, in the following description, descriptions of commonly known structures and technologies are omitted to avoid unnecessarily obscuring the concept of the present disclosure.

The terms used herein are only for the purpose of describing specific embodiments, and are not intended to limit the present disclosure. The terms "comprise", "include" and the like used herein indicate a presence of a feature, a step, an operation and/or a component, but do not exclude a presence or an addition of one or more other features, steps, operations or components.

The present disclosure provides a multifunctional lithography device to solve the problem that a current lithography device may only achieve a single lithography mode.

Figure 1:
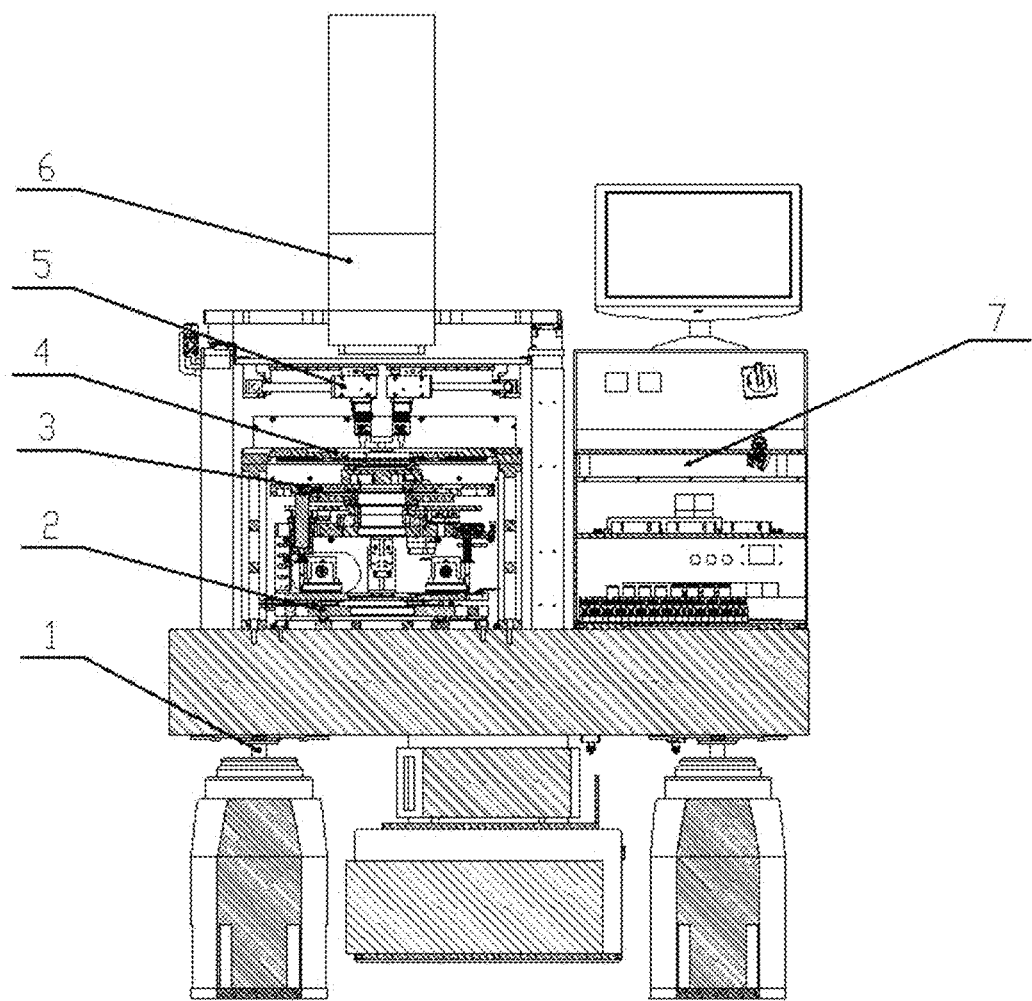
FIG. 1 schematically shows a schematic diagram of a multifunctional lithography device according to the embodiments of the present disclosure.

FIG. 1 schematically shows a schematic diagram of a multifunctional lithography device according to the embodiments of the present disclosure.

As shown in FIG. 1, the multifunctional lithography device according to the embodiments of the present disclosure includes: a vacuum substrate-carrying stage 12, a mask frame 4, a substrate-carrying stage motion system, an ultraviolet light source system 6, and a three-axis alignment optical path system 5. Specifically, the functions and positional relationships of the constituent parts of the multifunctional lithography device according to the embodiments of the present disclosure are as follows.

The vacuum substrate-carrying stage 12 is configured to place a substrate 32, adsorb the substrate 32 on the vacuum substrate-carrying stage 12 by controlling airflow, and provide a vacuum environment for the substrate 32 and a mask plate 31, so as to control a gap between the substrate 32 and the mask plate 31.

The mask frame 4 is arranged above the vacuum substrate-carrying stage 12 and configured to fix the mask plate 31.

The substrate-carrying stage motion system is arranged below the vacuum substrate-carrying stage 12 and configured to adjust a position of the vacuum substrate-carrying stage 12, so that a distance between the substrate 32 and the mask plate 31 satisfies a preset condition.

The ultraviolet light source system 6 is arranged above the mask plate 31 and configured to generate an ultraviolet light for lithography.

The three-axis alignment optical path system 5 is configured to align the ultraviolet light with the mask plate 31.

In the multifunctional lithography device according to the embodiments of the present disclosure, a coarse adjustment and a fine adjustment for the position of the vacuum substrate-carrying stage 12 may be further performed through the substrate-carrying stage motion system, so that the distance between the substrate 32 on the vacuum substrate-carrying stage 12 and the mask plate 31 on the mask frame 4 meets the requirements of various lithography modes. For example, when a proximity mode lithography technology is implemented, a gap between the substrate-carrying stage and the mask plate 31 is controlled by the substrate-carrying stage motion system, and the substrate 32 is vacuum-adsorbed on the substrate-carrying stage through the vacuum substrate-carrying stage 12 by means of controlling an airflow of dense pores on the surface, so that the gap between the substrate 32 and the mask plate 31 is controllable. For another example, based on the adjustment conditions of the proximity mode lithography technology, a hard contact between the substrate 32 and the mask plate 31 occurs by adjusting the substrate-carrying stage motion system and the vacuum substrate-carrying stage 12, and meanwhile, a vacuum environment is created using a closed space in the vacuum substrate-carrying stage to improve tightness between the substrate 32 and the mask plate 31, thereby achieving a contact mode lithography technology. The multifunctional lithography device may also achieve a Talbot mode lithography technology in a manner that gratings are made on the mask plate 31, and required area patterns are transferred to the substrate 32 to achieve array patterns. An SP lithography mode technology may also be achieved in a manner that metals such as chrome and gold are plated on a surface of a base plate, and a plasma resonance is generated under an ultraviolet light irradiation to implement a surface plasma lithography.

The structure of the substrate-carrying stage motion system of the multifunctional lithography device according to the embodiments of the present disclosure will be described in detail below.

As shown in FIG. 1, the substrate-carrying stage motion system includes an XY-direction macro motion system 2 and a Z-direction macro-micro three-point leveling system, wherein the XY-direction macro motion system 2 is configured to adjust displacements of the vacuum substrate-carrying stage 12 in an X-axis direction and a Y-axis direction, and the Z-direction macro-micro three-point leveling system 3 is arranged on the XY-direction macro motion system 2, and configured to implement a coarse adjustment and a fine adjustment of a displacement of the vacuum substrate-carrying stage 12 in a Z-axis direction. A mark of the substrate 32 is aligned with a mark of the mask plate 31 by adjusting the XY-direction macro motion system 2 and the Z-direction macro-micro three-point leveling system 3, and the distance between the substrate 32 and the mask plate 31 are adjusted according to the mode of the lithography technology to be achieved, thereby facilitating implementation of the lithography technology. Specifically, a schematic diagram of the structures of the XY-direction macro motion system 2 and the Z-direction macro-micro three-point leveling system 3 is shown in FIG. 2.

Figure 2:
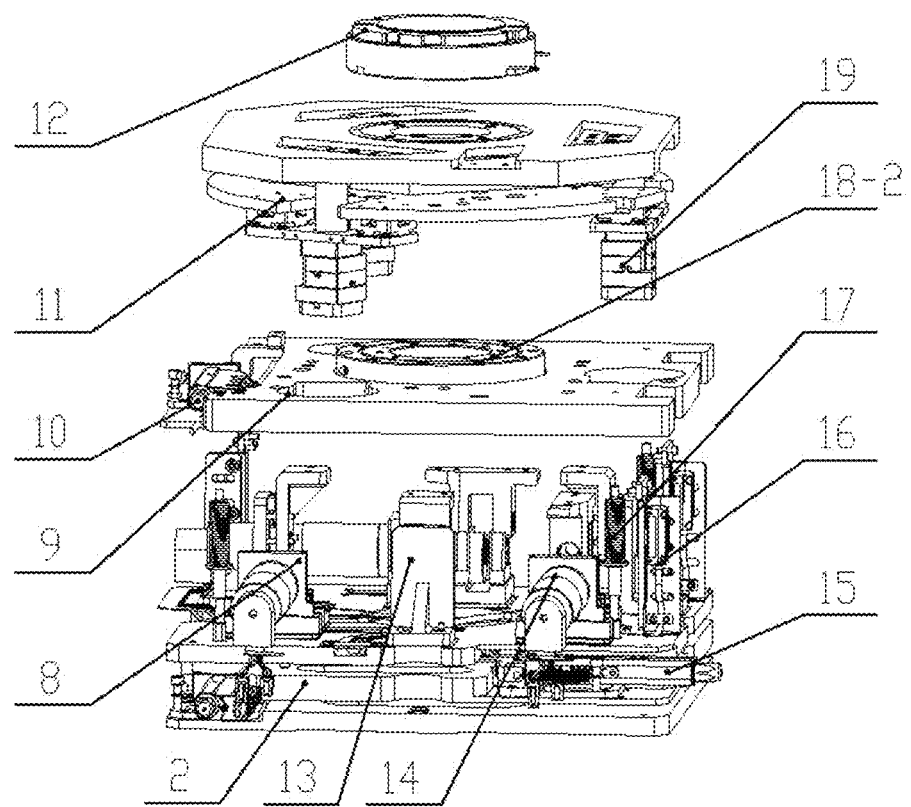
FIG. 2 schematically shows a schematic diagram of a substrate-carrying stage motion system according to the embodiments of the present disclosure.

FIG. 2 schematically shows a schematic diagram of a substrate-carrying stage motion system according to the embodiments of the present disclosure.

As shown in FIG. 2, the XY-direction macro motion system 2 is located on a bottom portion of the substrate-carrying stage motion system. Referring to FIG. 1, the substrate-carrying stage motion system is arranged on a passive vibration isolation system 1. The passive vibration isolation system 1 includes a marble platform and vibration isolation legs distributed at 4 corners of the marble platform, wherein the marble platform has a thickness of 200 mm. The passive vibration isolation system 1 is configured to support the multifunctional lithography device and isolate mechanical and bottom surface vibrations. The XY-direction macro motion system 2 is the bottom portion of the substrate-carrying stage motion system, and is the closest to the marble platform.

Figure 3:
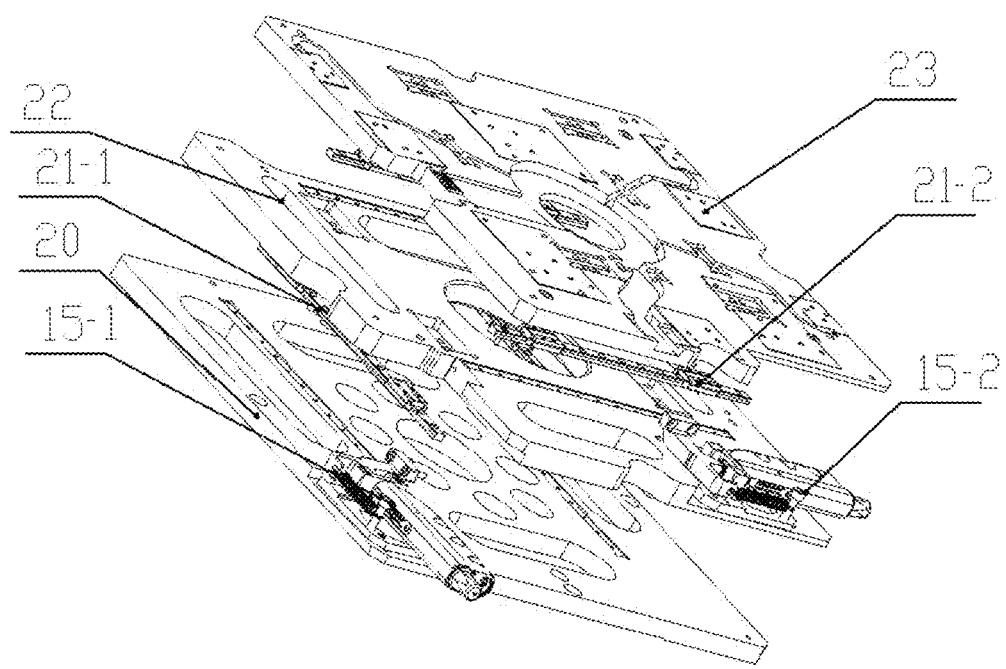
FIG. 3 schematically shows a schematic diagram of an XY-direction macro motion system 2 according to the embodiments of the present disclosure.

FIG. 3 schematically shows a schematic diagram of an XY-direction macro motion system 2 according to the embodiments of the present disclosure.

As shown in FIG. 3, the XY-direction macro motion system 2 includes: a motion base plate 20, a first linear guide rail 21-1, a Y-direction motion plate 22, a second linear guide rail 21-2, an X-direction motion plate 23, a first linear actuator 15-1, and a second linear actuator 15-2, wherein the first linear guide rail 21-1 is arranged on the motion base plate 20 and has a direction of a Y-axis direction; the Y-direction motion plate 22 is arranged on the first linear guide rail 21-1; the second linear guide rail 21-2 is arranged on the Y-direction motion plate 22 and has a direction of an X-axis direction perpendicular to the Y-axis direction; the X-direction motion plate 23 is arranged on the second linear guide rail 21-2; the first linear actuator 15-1 is arranged on the motion base plate 20, and configured to move the Y-direction motion plate 22 along the first linear guide rail 21-1; and the second linear actuator 15-2 is arranged on the Y-direction motion plate 22, and configured to move the X-direction motion plate 23 along the second linear guide rail 21-2.

According to the embodiments of the present disclosure, the Y-direction motion plate 22 is driven by the first linear actuator 15-1 to move along the first linear guide rail 21-1, so as to cause a Y-direction macro displacement of the vacuum substrate-carrying stage 12, and the X-direction motion plate 23 is driven by the second linear actuator 15-2 to move along the second linear guide 21-2, so as to cause an X-direction macro displacement of the vacuum substrate-carrying stage 12, so that a displacement of the vacuum substrate-carrying stage 12 in a horizontal plane is adjusted through the XY-direction macro motion system 2.

As shown in FIG. 2, the Z-direction macro-micro three-point leveling system 3 is above the XY-direction macro motion system 2. The Z-direction macro-micro three-point leveling system 3 is arranged on the X-direction motion plate 23 of the XY-direction macro motion system 2, and includes: an angular displacement mechanism 9 and a coarse displacement closed-loop system 8. The Z-direction coarse displacement rotary motor 14, the linear guide rail anti-deviation mechanism 13, and the three-point incremental grating ruler 16 constitute the coarse displacement closed-loop system 8. The coarse displacement closed-loop system 8 acts on a mounting plane of the angular displacement mechanism 9, so that the vacuum substrate-carrying stage 12 is displaced along the Z-axis direction, thereby achieving a more accurate regulation to the Z-direction displacement of the vacuum substrate-carrying stage 12. The Z-direction coarse displacement rotary motor 14 is configured to adjust a displacement of the vacuum substrate-carrying stage 12 along the Z-axis direction perpendicular to the X-axis direction and the Y-axis direction, the linear guide rail anti-deviation mechanism 13 is configured to ensure that the Z-direction coarse displacement rotary motor 14 only outputs a Z-direction displacement, and the three-point incremental grating ruler 16 is configured to read a Z-direction displacement actually generated by the Z-direction coarse displacement rotary motor 14. The coarse displacement closed-loop system 8 is configured to feeds back and controls an operation of the Z-direction coarse displacement rotary motor 14 according to the Z-direction displacement actually generated. A compression spring 17 supports the angular displacement mechanism 9 with a uniform compression force to reduce a Z-direction static load of the Z-direction coarse displacement rotary motor 14.

The Z-direction macro-micro three-point leveling system 3 further includes: a three-point Z-direction fine displacement mechanism 11 arranged on the angular displacement mechanism 9 and configured to level the vacuum substrate-carrying stage 12, adjust an angle of the vacuum substrate-carrying stage 12 in a plane where an X-axis and a Y-axis are located, and implement a fine adjustment of the distance between the substrate 32 on the vacuum substrate-carrying stage 12 and the mask plate 31.

Figure 4:
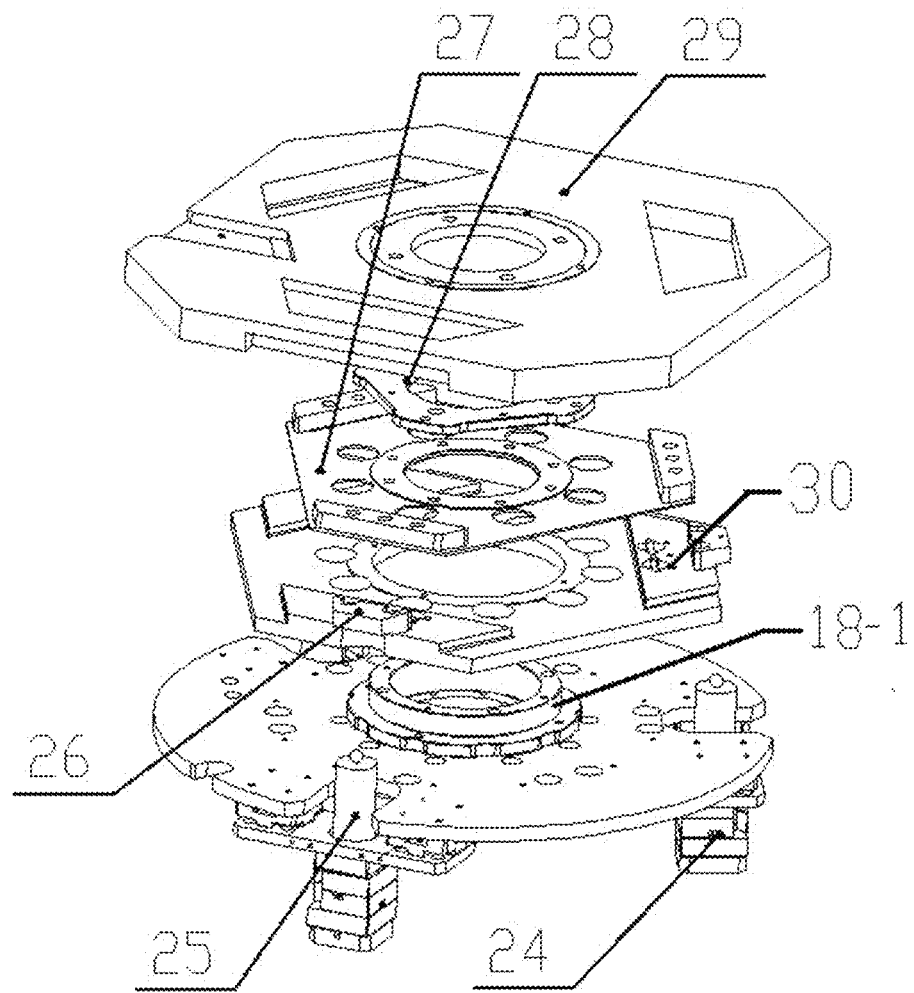
FIG. 4 schematically shows a schematic diagram of a Z-direction macro-micro three-point leveling system 3 according to the embodiments of the present disclosure.

FIG. 4 schematically shows a schematic diagram of a Z-direction macro-micro three-point leveling system 3 according to the embodiments of the present disclosure.

As shown in FIG. 4, the three-point Z-direction fine displacement mechanism 11 includes: a mechanism bottom plate, a plurality of piezoelectric ceramic motor assemblies 19, a universal ball support 26, at least one extension spring 30, an elastic reed 27, a flange adapter 28, and a substrate-carrying stage support surface 29. The flange plate 18-1 is arranged in a middle portion of the mechanism bottom plate. The plurality of piezoelectric ceramic motor assemblies 19 are evenly distributed on the mechanism bottom plate and configured to micro-adjust an inclination angle of the vacuum substrate-carrying stage 12 in the Z-axis direction, level the vacuum substrate-carrying stage 12, and implement the fine adjustment of the distance between the substrate 32 on the vacuum substrate-carrying stage 12 and the mask plate 31. Specifically, the piezoelectric ceramic motor assembly 19 is constituted by a piezoelectric motor mounting accessory 24 and a piezoelectric motor 25. The piezoelectric motor 25 is mounted on one end of the piezoelectric motor mounting accessories 24, and a ball connection of the piezoelectric motor is mounted on the universal ball support 26. The universal ball support 26 is arranged on a plate member above the mechanism bottom plate and connected with the piezoelectric ceramic motor assembly 19; the extension spring 30 is connected with the mechanism bottom plate and the plate member on which the universal ball support 26 is arranged, so as to drive the plate member to move downwardly along the Z-axis when the piezoelectric ceramic motor assembly 19 is rest; the elastic reed 27 is arranged above the universal ball support 26 and connected with the plurality of piezoelectric ceramic motor assemblies 19, so that the vacuum substrate-carrying stage 12 is uniformly sprung back; the flange adapter 28 is arranged on the elastic reed 27, connected with the flange plate 18-1 through the elastic reed and a circular hole in the plate member, and configured to adjust the angle of the vacuum substrate-carrying stage 12 in the plane where the X-axis and the Y-axis are located based on a drive of the flange plate 18-1; and a center of the substrate-carrying stage support surface 29 is connected with the flange adapter 28, and connected with the elastic reed 27 through the flange adapter 28 to place the vacuum substrate-carrying stage 12.

Referring to FIG. 2, the angular displacement mechanism 9 includes: a crossed roller bearing 18-2 and an angular displacement linear motor 10. The crossed roller bearing 18-2 is arranged on a plane of the angular displacement mechanism 9, connected with the flange plate 18-1, and configured to drive the flange plate 18-1, thereby adjusting an angle of the vacuum substrate-carrying stage 12. The angular displacement linear motor 10 is configured to drive the crossed roller bearing 18-2. The angular displacement linear motor 10 pushes the three-point Z-direction fine displacement mechanism 11 to perform a Z-direction motion as a whole, and the crossed roller bearing 18-2 is configured as a rotating support structure to implement an overall angular displacement motion of the three-point Z-direction fine displacement mechanism 11. As shown in FIG. 2, the angular displacement mechanism 9 is supported on the Z-direction coarse displacement rotary motor 14 by the compression spring 17, and the Z-direction static load of the Z-direction coarse displacement rotary motor 14 may be reduced in a manner that the angular displacement mechanism 9 is supported by the compression spring 17.

In the embodiments of the present disclosure, the substrate-carrying stage motion system includes the XY-direction macro-motion system 2 and the Z-direction macro-micro three-point leveling system 3, the XY-direction macro-motion system 2 is configured to adjust motions of the vacuum substrate-carrying stage 12 in the X and Y directions, the coarse displacement closed-loop system 8 is placed on a grinding surface of the upper surface of the XY-direction macro-motion system 2, and implements a coarse leveling of the substrate-carrying stage 12 using a three-point design solution, the angular displacement mechanism 9 supported on the coarse displacement closed-loop system 8 enables the three-point Z-direction fine displacement mechanism 11 to have a great micro adjustment performance, and the vacuum substrate-carrying stage 12 is arranged on a topmost layer and integrates a summation of all motions to finally achieve a macro-micro-leveling and alignment.

According to the embodiments of the present disclosure, the position of the vacuum substrate-carrying stage 12 is controlled and adjusted by the substrate-carrying stage motion system, the substrate 32 is adsorbed and fixed on the vacuum stage 12 by regulating the airflow on the surface of the vacuum substrate-carrying stage 12 (a plurality of through holes for circulating the airflow are provided on the surface of the vacuum substrate-carrying stage), a gap distance between the substrate 32 and the mask plate 31 may be adjusted by controlling the airflow for applications in different lithography modes; the mask frame 4 is independent from other parts are mounted on the marble, the mask plate 31 is replaced in a drawer manner, and the mask plate 31 is fixed for an exposure process; the three-axis alignment optical path system 5 includes: a dual telephoto objective lens, a three-axis symmetrical displacement system and a CCD camera, wherein the dual telephoto objective lens is mounted on the three-axis symmetrical displacement system, the three-axis symmetrical displacement system is configured to displace the dual telephoto objective lens along the X-axis, Y-axis, Z-axis direction, and the CCD camera is configured to photograph the substrate 32 and the mask plate 31, and transmit an imaging to a computer, so as to allow the computer to judge whether the mask plate 31 and the substrate 32 are aligned. The alignment optical path system aligns lithography marks using the three-axis symmetric system to improve an adjustment flexibility of a long-focus objective lens; the ultraviolet light source system 6 includes a complete set of optical path system, and positions an exposure location in a closed-loop manner by a Y-direction displacement and extension using a 365 nm light source to expose the substrate 32, and the ultraviolet light source system 6 uses a servo stepping type Y-direction motion, thereby improving the uniformity of light intensity in an exposure area.

Referring to FIG. 1, a control system is provided next to the multifunctional lithography device according to the present disclosure and the control system may include a PLC, a power supply, a driver, a switch, and a cable arrangement etc., so as to control the constituent parts in the multifunctional lithography device according to the embodiments of the present disclosure. For example, the control system sequentially controls the motors in the substrate-carrying stage motion system according to a preset sequence, so as to implement a position adjustment of the vacuum substrate-carrying stage 12, adjusts the position of the substrate 32 and the mask plate 31 in combination with the images fed back by the CCD camera and after the position between the substrate 32 and the mask plate 31 satisfies the preset condition, the control system controls the ultraviolet light source system 6 to implement an exposure of the substrate 32, and further achieve lithography. The control system is arranged close to the motion device, thereby improving the compactness of the device.

FIG. 5 to FIG. 8 schematically show schematic diagrams of a proximity lithography mode, a contact lithography mode, a Talbot lithography mode, and an SP lithography mode, respectively.

Figure 5:
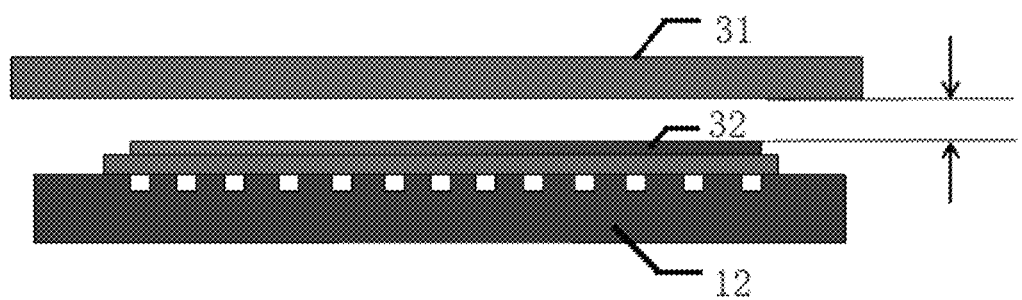
FIG. 5 schematically shows a schematic diagram of a proximity mode exposure according to the embodiments of the present disclosure.

As shown in FIG. 5, the multifunctional lithography device according to the embodiments of the present disclosure may achieve the proximity mode lithography technology, wherein a macro-micro displacement leveling and a rising distance determination of the vacuum substrate-carrying stage 12 may be implemented, and the gap between the substrate 32 on the vacuum substrate-carrying stage 12 and the mask plate 31 is controlled through the substrate-carrying stage motion system, and the substrate 32 is vacuum-adsorbed on the vacuum substrate-carrying stage 12 by controlling the airflow on the surface of the vacuum substrate-carrying stage 12, thereby determining that the gap between the substrate 32 and the mask plate 31 is controllable.

Figure 6:
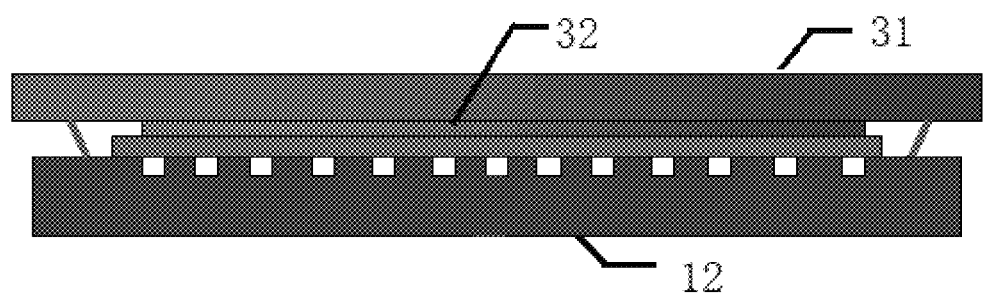
FIG. 6 schematically shows a schematic diagram of a contact mode exposure according to the embodiments of the present disclosure.

As shown in FIG. 6, the multifunctional lithography device according to the embodiments of the present disclosure may achieve the contact mode lithography technology. The control manner is similar to that of the proximity mode lithography, but after a hard contact between the mask plate 31 and the substrate 32, an outer layer sealing system of the vacuum substrate-carrying stage is activated to vacuum an inside of the vacuum substrate-carrying stage. At this time, the substrate 32 is vacuum-adsorbed by the vacuum substrate-carrying stage 12, and the substrate 32 and the mask plate 31 are closely attached. A vacuum environment improves a close exposure of the substrate 32 and the mask plate 31.

Figure 7:
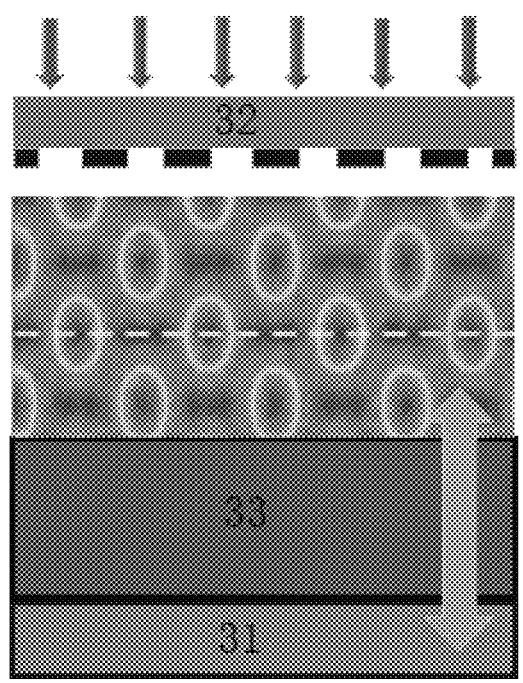
FIG. 7 schematically shows a schematic diagram of a Talbot lithography mode according to the embodiments of the present disclosure.

As shown in FIG. 7, the multifunctional lithography device according to the embodiments of the present disclosure may achieve the Talbot lithography mode technology, wherein gratings are made on the mask plate 31, and required area patterns are transferred to the substrate 32 through a photoresist 33 to achieve array patterns.

Figure 8:
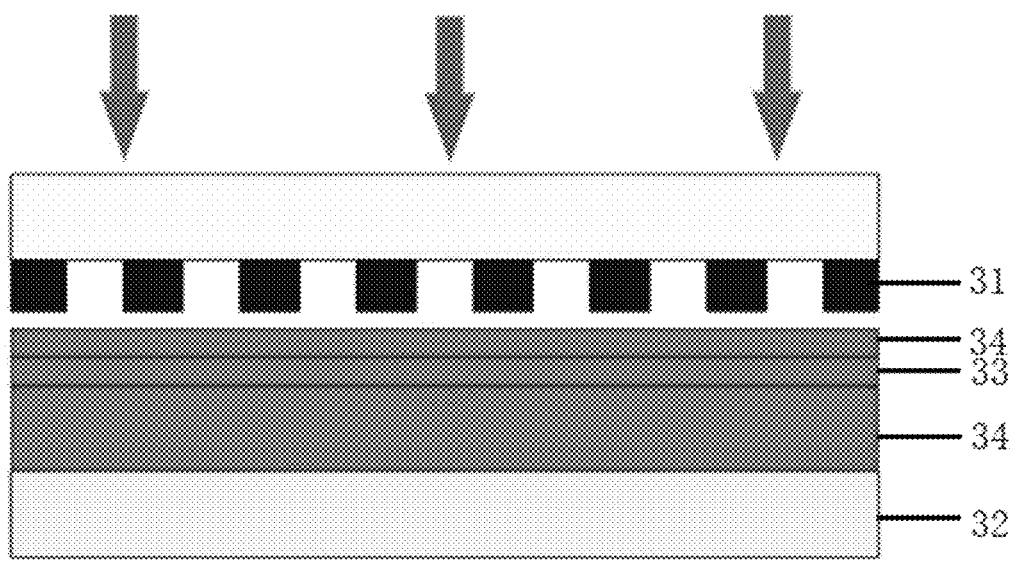
FIG. 8 schematically shows a schematic diagram of an SP lithography mode according to the embodiments of the present disclosure.

As shown in FIG. 8, the multifunctional lithography device according to the embodiments of the present disclosure may achieve the SP lithography mode technology, wherein metals (as shown by reference sign 34 in FIG. 8) such as chrome, gold and silver are plated on surfaces of the substrate 32 and the photoresist 33, so that a plasma resonance is generated under an ultraviolet light irradiation to implement a surface plasma lithography, i.e., the SP lithography mode technology.

Referring to FIG. 1 to FIG. 4, there is provided a multifunctional lithography device according to another embodiment in the embodiments of the present disclosure, including: a passive vibration isolation system 1, an XY-direction macro-motion system 2, a Z-direction macro-micro three-point leveling system 3, a mask frame 4, a three-axis alignment optical path system 5, an ultraviolet light source system 6, a control system 7, a coarse displacement closed-loop system 8, an angular displacement mechanism 9, an angular displacement linear motor 10, a three-point Z-direction fine displacement mechanism 11, a vacuum substrate-carrying stage mechanism 12, a linear guide rail anti-deviation mechanism 13, a Z-direction coarse displacement rotary motor 14, a first linear actuator 15-1, a second linear actuator 15-2, a three-point incremental grating ruler 16, a compression spring 17, a crossed roller bearing 18, a piezoelectric ceramic motor assembly 19, a motion base plate 20, a first linear guide rail 21-1, a second linear guide rail 21-2, a Y-direction motion plate 22, an X-direction motion plate 23, piezoelectric motor mounting accessories 24, a piezoelectric motor 25, a universal ball support 26, an elastic read 27, a flange adapter 28, a substrate-carrying stage support surface 29 and an extension spring 30; wherein the passive vibration isolation system 1 includes 4 evenly and symmetrically arranged vibration isolation legs and a marble platform having a thickness of 200 mm, a bottom layer of the XY-direction macro-motion system 2 is the motion base plate 20 arranged on the passive vibration isolation system 1, the first linear guide rail 21-1 is arranged on a mounting plane of the motion base plate 20 to carry the Y-direction motion plate 22, so that the Y-direction motion plate 22 is pushed by the first linear actuator 15-1 to implement a Y-direction macro displacement, the second linear guide 21-2 is mounted on a mounting plane of the Y-direction motion plate 22 to carry the X-direction motion plate 23, so that the X-direction motion plate 23 is pushed by the second linear actuator 15-2 arranged on the Y-direction motion plate 22 to implement an X-direction macro displacement, the Z-direction macro-micro three-point leveling system 3 implements placing a substrate on the substrate-carrying stage and aligning marks of the substrate and a mask plate, and includes the coarse displacement closed-loop system 8 arranged on the XY-direction macro motion system 2, the three-point linear guide rail anti-deflection mechanism 13 ensures that the Z-direction coarse displacement rotary motor 14 may only output a Z-direction displacement on a rotary cam, the three-point incremental grating ruler 16 reads an actual Z-direction motion displacement to achieve a closed-loop control to the coarse displacement rotary motor 14, the compression spring 17 reduces a Z-direction static load of the Z-direction coarse displacement rotary motor 14 through the angle displacement mechanism 9 supported by the compression spring, the angular displacement linear motor 10 pushes the three-point Z-direction fine displacement mechanism 11 to move as a whole, the crossed roller bearing 18-2 is configured as a rotating support structure to implement an overall angular displacement motion of the three-point Z-direction fine displacement mechanism 11, the piezoelectric ceramic motor assembly 19 is constituted by the piezoelectric motor mounting accessory 24 and the piezoelectric motor 25, and mounted on the three-point Z-direction fine displacement mechanism 11 as a whole, the three-point piezoelectric motor 25 is mounted on the universal ball support 26 through a ball connection, upper and lower connection plates of the piezoelectric motor 25 implement a micro force return of the piezoelectric motor 25 using the extension spring 30, the elastic reed 27 is fixedly connected with the piezoelectric motor 25, a central flange is connected to a lower plane of the substrate-carrying stage support surface 29, so that an entire vacuum substrate-carrying stage mechanism 12 is evenly rebounded; the vacuum substrate-carrying stage mechanism 12 completes an adsorption and an air blow for the substrate in a multi-hole manner, the mask frame 4 fixes the mask plate using three manual knobs in a pulling type fixing and mask clamping manner, the three-axis alignment optical path system 5 includes a three-axis symmetrical displacement system, a telephoto objective lens, a CCD camera and an overall optical path system, a dual telephoto objective lens is mounted in the three-axis symmetrical displacement system to implement an XYZ direction displacement of an alignment objective lens, and is imaged to a PC end by the CCD camera to judge an alignment of marks of the mask plate and the substrate, the ultraviolet light source system 6 includes a complete set of optical path system, and positions an exposure location in a closed-loop manner by a Y-direction displacement and extension using a 365 nm light source to achieve a substrate exposure effect, and a control system 7 is configured to control the device.

Referring to FIG. 1, according to the embodiments of the present disclosure, the passive vibration isolation system 1, the XY-direction macro-motion system 2, the Z-direction macro-micro three-point leveling system 3, the mask frame 4, the three-axis alignment optical path system 5, the ultraviolet light source system 6, and the control system 7 constitute an integral device, the device control system 7 of the integral device is also arranged together with the integral device, exposure functions include four exposure modes: a contact mode, a proximity mode, a Talbot lithography mode, and an SP lithography mode; and the control system 7 includes all circuit systems of the device: a PLC, a power supply, a driver, a switch, and a cable arrangement, so that the device is optimized as a whole.

According to the embodiments of the present disclosure, a stator of the first linear actuator 15-1 is mounted on the motion base plate 20, and a mover of the first linear actuator 15-1 is mounted on the Y-direction motion plate 22, so as to implement a Y-direction motion of the Y-direction motion plate 22 through a low friction guide of the first linear guide rail 21-1, and in a same manner, a stator of the second linear actuator 15-2 is mounted on the Y-direction motion plate 22, and a mover of the second linear actuator 15-2 is mounted on the X-direction motion plate 23, so as to implement an X-direction motion of the X-direction motion plate 23 through the second linear guide rail 21-1.

According to the embodiments of the present disclosure, the substrate-carrying stage motion system includes the XY-direction macro-motion system 2 and the Z-direction macro-micro three-point leveling system 3, and completes an XY-direction displacement using a construction of the first linear actuator 15-1 and the second linear actuator 15-2 with the first linear guide rail 21-1 and the second linear guide rail 21-2, the coarse displacement closed-loop system 8 is placed on a grinding surface of the upper surface of the XY-direction macro-motion system 2, and implements a coarse leveling of the substrate-carrying stage using a three-point design solution, the coarse displacement closed-loop system 8 and the angular displacement mechanism 9 enable the three-point Z-direction fine displacement mechanism 11 to have a great micro adjustment performance, and the vacuum substrate-carrying stage mechanism 12 is arranged on a topmost layer and integrates a summation of all motions to implement a four-axis macro-micro-leveling and alignment function.

According to the embodiments of the present disclosure, the coarse displacement closed-loop system 8 includes the linear guide rail anti-deviation mechanism 13, the Z-direction coarse displacement rotary motor 14, the three-point incremental grating ruler 16, the compression spring 17, and a cam mounting assembly, the cam is driven to move by a rotation of the three-point Z-direction coarse displacement rotary motor 14, an uneven rotation of the cam causes a change in a plane height of the angular displacement mechanism 9, the linear guide rail anti-deviation mechanism 13 prevents the mechanism from being damaged due to an excessively large difference in a three-point lifting height, Z-direction height differences of the three-point motor are respectively recorded by the three-point incremental grating ruler 16, so as to control and adjust a level of the angular displacement mechanism 9, the cam of the linear guide rail anti-deviation mechanism 13 enters a descending process, and the compression spring bears an overall weight to avoid a fatigue damage of the cam.

According to the embodiments of the present disclosure, in the angular displacement mechanism 9, a stator of the angular displacement linear motor 10 is fixed on an outer ring mounting plate of the crossed roller bearing 18, and a mover of the angular displacement linear motor 10 is fixed on the three-point Z-direction fine displacement mechanism 11, the three-point Z-direction fine displacement mechanism 11 is connected with an inner ring of the crossed roller bearing 18-2 by a screw, the three-point Z-direction fine displacement mechanism 11 is driven by the angular displacement linear motor 10 to implement a small angle rotation with a center of the crossed roller bearing 18-2 as a rotation axis, and the vacuum substrate-carrying stage mechanism 12 may perform an XYθ displacement and a Z-direction coarse and fine displacement adjustment and leveling.

The multifunctional lithography device provided by the present disclosure may achieve a high precision leveling of the substrate-carrying stage and an alignment of the mark of the substrate 32 through the substrate-carrying stage motion system, may control the airflow through the vacuum substrate-carrying stage 12, so that the substrate 32 is closed attached with the mask plate 31, may adjust the distance between the substrate 32 and the mask plate 31 to meet an expectation by adjusting the substrate-carrying stage motion system, and may also achieve four lithography exposure modes: a contact mode, a proximity mode, a Talbot lithography mode, and an SP lithography mode by cooperating with the ultraviolet light source system 6.

According to the embodiments of the present disclosure, the piezoelectric motor mounting accessories 24 fix the piezoelectric motor 25, a top of the piezoelectric motor 25 is connected to the universal ball support 26 by the universal ball, an elastic contraction of a fine displacement portion is achieved by the elastic reed 27, and the elastic reed 27 is connected with a center of the substrate-carrying stage support surface 29 through the flange adapter 28, so as to implement a stable Z-direction fine displacement motion of the vacuum substrate-carrying stage mechanism 12.

Those skilled in the art may understand that various combinations and/or collaborations of the features recited in various embodiments and/or claims of the present disclosure may be performed, even if such combinations or collaborations are not explicitly recited in the present disclosure. In particular, various combinations and/or collaborations of the features recited in various embodiments and/or claims of the present disclosure may be made without departing from the spirit and teaching of the present disclosure. All these combinations and/or collaborations will fall within the scope of the present disclosure.

The present disclosure has been exemplarily represented and described with reference to specific exemplary embodiments of the present disclosure. However, those skilled in the art should understand that, various changes in form and detail may be made to the present disclosure without departing from the spirit and scope of the present disclosure defined by the appended claims and the equivalents thereof. Therefore, the scope of the present disclosure should not be limited to the above embodiments, but should be determined not only by the appended claims, but also by the equivalents thereof.

What is claimed is:

1. A multifunctional lithography device, comprising:
   a vacuum substrate-carrying stage, wherein the vacuum substrate-carrying stage is configured to place a substrate, adsorb the substrate on the vacuum substrate-carrying stage by controlling an airflow, and provide a vacuum environment for the substrate and a mask plate, so as to control a gap between the substrate and the mask plate;
   a mask frame arranged above the vacuum substrate-carrying stage and configured to fix the mask plate;
   a substrate-carrying stage motion system arranged below the vacuum substrate-carrying stage and configured to adjust a position of the vacuum substrate-carrying stage, so that a distance between the substrate and the mask plate satisfies a preset condition;
   an ultraviolet light source system arranged above the mask plate and configured to generate an ultraviolet light for lithography; and
   a three-axis alignment optical path system configured to align the ultraviolet light with the mask plate;
   wherein the substrate-carrying stage motion system comprises:
   an XY-direction macro motion system configured to adjust displacements of the vacuum substrate-carrying stage in an X-axis direction and a Y-axis direction;
   a Z-direction macro-micro three-point leveling system arranged on the XY-direction macro motion system, and configured to implement a coarse adjustment and a fine adjustment of a displacement of the vacuum substrate-carrying stage in a Z-axis direction,
   wherein the XY-direction macro motion system comprises:
   a motion base plate;
   a first linear guide rail arranged on the motion base plate and having a direction of a Y-axis direction;
   a Y-direction motion plate arranged on the first linear guide rail;
   a second linear guide rail arranged on the Y-direction motion plate and having a direction of an X-axis direction perpendicular to the Y-axis direction;

an X-direction motion plate arranged on the second linear guide rail;
a first linear actuator arranged on the motion base plate, and configured to move the Y-direction motion plate along the first linear guide rail; and
a second linear actuator arranged on the Y-direction motion plate, and configured to move the X-direction motion plate along the second linear guide rail,
wherein the Z-direction macro-micro three-point leveling system is arranged on the X-direction motion plate and comprises:
a coarse displacement closed-loop system and an angular displacement mechanism, wherein the coarse displacement closed-loop system acts on the angular displacement mechanism, so that the vacuum substrate-carrying stage is displaced in the Z-axis direction, and the coarse displacement closed-loop system comprises:
a Z-direction coarse displacement rotary motor configured to adjust the displacement of the vacuum substrate-carrying stage in the Z-axis direction perpendicular to the X-axis direction and the Y-axis direction, wherein the coarse displacement closed-loop system feeds back and controls an operation of the Z-direction coarse displacement rotary motor according to a Z-direction displacement actually generated by the angular displacement mechanism;
a linear guide rail anti-deviation mechanism configured to ensure that the Z-direction coarse displacement rotary motor only outputs a Z-direction displacement; and
a three-point incremental grating ruler configured to read a Z-direction displacement actually generated by the Z-direction coarse displacement rotary motor.

2. The device according to claim 1, wherein the Z-direction macro-micro three-point leveling system further comprises:
a three-point Z-direction fine displacement mechanism arranged on the angular displacement mechanism and configured to level the vacuum substrate-carrying stage, adjust an angle of the vacuum substrate-carrying stage in a plane where an X-axis and a Y-axis are located, and implement a fine adjustment of the distance between the substrate on the vacuum substrate-carrying stage and the mask plate.

3. The device according to claim 2, wherein the three-point Z-direction fine displacement mechanism comprises:
a mechanism bottom plate, wherein a flange plate is arranged in a middle portion of the mechanism bottom plate;
a plurality of piezoelectric ceramic motor assemblies evenly distributed on the mechanism bottom plate and configured to micro-adjust an inclination angle of the vacuum substrate-carrying stage in the Z-axis direction, level the vacuum substrate-carrying stage, and implement the fine adjustment of the distance between the substrate on the vacuum substrate-carrying stage and the mask plate;
a universal ball support arranged above the mechanism bottom plate and connected with the piezoelectric ceramic motor assembly;
at least one extension spring connecting the mechanism bottom plate and a plate member on which the universal ball support is arranged, and configured to reset the plate member;
an elastic reed arranged above the universal ball support and connected with the plurality of piezoelectric ceramic motor assemblies;
a flange adapter arranged on the elastic reed, connected with the flange plate through the elastic reed and a circular hole in the plate member, and configured to adjust the angle of the vacuum substrate-carrying stage in the plane where the X-axis and the Y-axis are located based on a driving of the flange plate; and
a substrate-carrying stage support surface, wherein a center of the substrate-carrying stage support surface is connected with the flange adapter and connected with the elastic reed through the flange adapter, and the substrate-carrying stage support surface is configured to place the vacuum substrate-carrying stage.

4. The device according to claim 3, wherein the angular displacement mechanism comprises:
a crossed roller bearing arranged on a plane of the angular displacement mechanism, connected with the flange plate (18-1), and configured to drive the flange plate; and
an angular displacement linear motor configured to drive the crossed roller bearing.

5. The device according to claim 1, wherein a compression spring is supported below the angular displacement mechanism and configured to reduce a Z-direction static load of the Z-direction coarse displacement rotary motor.

6. The device according to claim 1, further comprising:
a passive vibration isolation system comprising a marble platform and vibration isolation legs distributed at four corners of the marble platform;
wherein the substrate-carrying stage motion system is placed on the passive vibration isolation system.

7. The device according to claim 1, wherein the three-axis alignment optical path system comprises:
a dual telephoto objective lens mounted on a three-axis symmetrical displacement system;
the three-axis symmetrical displacement system configured to displace the dual telephoto objective lens along the X-axis, Y-axis, Z-axis direction; and
a charged coupled device (CCD) camera configured to photograph the substrate and the mask plate, and transmit an imaging to a computer, so as to allow the computer to judge whether the mask plate and the substrate are aligned.

8. A multifunctional lithography device, comprising: a passive vibration isolation system, an XY-direction macro-motion system, a Z-direction macro-micro three-point leveling system, a mask frame, a three-axis alignment optical path system, an ultraviolet light source system, a control system (7), a coarse displacement closed-loop system, an angular displacement mechanism, an angular displacement linear motor, a three-point Z-direction fine displacement mechanism, a vacuum substrate-carrying stage mechanism, a linear guide rail anti-deviation mechanism, a Z-direction coarse displacement rotary motor, a first linear actuator, a second linear actuator (15-2), a three-point incremental grating ruler, a compression spring, a crossed roller bearing, piezoelectric ceramic motor assembly, a motion base plate, a first linear guide rail, a second linear guide rail, a Y-direction motion plate, an X-direction motion plate, piezoelectric motor mounting accessories, a piezoelectric motor, a universal ball support, an elastic read, a flange adapter, a substrate-carrying stage support surface and an extension spring; wherein the passive vibration isolation system comprises 4 evenly and symmetrically arranged vibration isolation legs and a marble platform having a thickness of 200 mm, a bottom layer of the XY-direction macro-motion system is the motion base plate arranged on the passive vibration isolation system, the first linear guide rail is arranged on a mounting plane of the motion base plate to carry the Y-direction motion plate, so that the Y-direction motion plate is pushed by the first linear actuator to implement a Y-direction macro displacement, the second linear guide is mounted on a mounting plane of the Y-direction motion plate to carry the X-direction motion plate, so that the X-direction motion plate is pushed by the second linear actuator arranged on the Y-direction motion plate to implement an X-direction macro displacement, the Z-direction macro-micro three-point leveling system implements placing a substrate on the substrate-carrying stage and aligning marks of the substrate and a mask plate, and comprises the coarse displacement closed-loop system arranged on the XY-direction macro motion system, the linear guide rail anti-deflection mechanism ensures that the Z-direction coarse displacement rotary motor only output a Z-direction displacement on a rotary cam, the three-point incremental grating ruler reads an actual Z-direction motion displacement to implement a closed-loop control to the coarse displacement rotary motor, the compression spring (17) reduces a Z-direction static load of the Z-direction coarse displacement rotary motor through the angle displacement mechanism supported by the compression spring, the angular displacement linear motor pushes the three-point Z-direction fine displacement mechanism to move as a whole, the crossed roller bearing is configured as a rotating support structure to implement an overall angular displacement motion of the three-point Z-direction fine displacement mechanism, the piezoelectric ceramic motor assembly is constituted by the piezoelectric motor mounting accessory and the piezoelectric motor, and mounted on the Z-direction fine displacement mechanism as a whole, the piezoelectric motor is mounted on the universal ball support through a ball connection, upper and lower connection plates of the piezoelectric motor implement a micro force return of the piezoelectric motor using the extension spring, the elastic reed is fixedly connected with the piezoelectric motor, a central flange is connected to a lower plane of the substrate-carrying stage support surface, so that an entire vacuum substrate-carrying stage mechanism is evenly rebounded; the vacuum substrate-carrying stage mechanism completes an adsorption and an air blow for the substrate in a multi-hole manner, the mask frame fixes the mask plate using three manual knobs in a pulling type fixing and mask clamping manner, the three-axis alignment optical path system comprises a three-axis symmetrical displacement system, a telephoto objective lens, a CCD camera and an overall optical path system, a dual telephoto objective lens is mounted in the three-axis symmetrical displacement system to implement an XYZ direction displacement of an alignment objective lens, and is imaged to a PC end by the CCD camera to judge an alignment of marks of the mask plate and the substrate, the ultraviolet light source system comprises a complete set of optical path system, and positions an exposure location in a closed-loop manner by a Y-direction displacement and extension using a 365 nm light source, so as to achieve a substrate exposure effect, and a control system is configured to control the device.

9. The multifunctional lithography device according claim 1, wherein the passive vibration isolation system, the XY-direction macro-motion system, the Z-direction macro-micro three-point leveling system, the mask frame (4), the three-axis alignment optical path system, the ultraviolet light source system, and the control system constitute an integral device, the device control system of the integral device is also arranged together with the integral device, exposure functions comprises four exposure modes: a contact mode, a proximity mode, a Talbot lithography mode, and an SP lithography mode; and the control system comprises all circuit systems of the device: a PLC, a power supply, a driver, a switch, and a cable arrangement, so that the device is optimized as a whole.

10. The multifunctional lithography device according claim 1, wherein a stator of the first linear actuator is mounted on the motion base plate, and a mover of the first linear actuator is mounted on the Y-direction motion plate, so as to implement a Y-direction motion of the Y-direction motion plate through a low friction guide of the first linear guide rail, and in a same manner, a stator of the second linear actuator is mounted on the Y-direction motion plate, and a mover of the second linear actuator is mounted on the X-direction motion plate, so as to implement an X-direction motion of the X-direction motion plate through the second linear guide rail.

11. The multifunctional lithography device according claim 8, wherein the substrate-carrying stage motion system comprises the XY-direction macro-motion system and the Z-direction macro-micro three-point leveling system, and completes an XY-direction displacement using a construction of the first linear actuator and the second linear actuator with the first linear guide rail and the second linear guide rail, the coarse displacement closed-loop system is placed on a grinding surface of the upper surface of the XY-direction macro-motion system, and implements a coarse leveling of the substrate-carrying stage using a three-point design solution, the coarse displacement closed-loop system and the angular displacement mechanism enable the three-point Z-direction fine displacement mechanism to have a great micro adjustment performance, and the vacuum substrate-carrying stage mechanism 12 is arranged on a topmost layer and integrates a summation of all motions to achieve a four-axis macro-micro-leveling and alignment function.

12. The multifunctional lithography device according claim 8, wherein the coarse displacement closed-loop system comprises the linear guide rail anti-deviation mechanism, the Z-direction coarse displacement rotary motor, the three-point incremental grating ruler, the compression spring, and a cam mounting assembly, the cam is driven to move by a rotation of the Z-direction coarse displacement rotary motor, an uneven rotation of the cam causes a change in a plane height of the angular displacement mechanism, the linear guide rail anti-deviation mechanism prevents the mechanism from being damaged due to an excessively large difference in a three-point lifting height, Z-direction height differences of the motor are respectively recorded by the three-point incremental grating ruler, so as to control and adjust a level of the angular displacement mechanism, the cam of the linear guide rail anti-deviation mechanism enters a descending process, and the compression spring bears an overall weight to avoid a fatigue damage of the cam.

13. The multifunctional lithography device according claim 8, wherein in the angular displacement mechanism, a stator of the angular displacement linear motor is fixed on an outer ring mounting plate of the crossed roller bearing, and a mover of the angular displacement linear motor is fixed on the three-point Z-direction fine displacement mechanism, the three-point Z-direction fine displacement mechanism is connected with an inner ring of the crossed roller bearing by a screw, the three-point Z-direction fine displacement mechanism is driven by the angular displacement linear motor to implement a small angle rotation with a center of the crossed roller bearing as a rotation axis, and the vacuum substrate-carrying stage mechanism may perform an XYθ displacement and a Z-direction coarse and fine displacement adjustment and leveling.

14. The multifunctional lithography device according claim 8, wherein the piezoelectric motor mounting accessories fix the piezoelectric motor, a top of the piezoelectric motor is connected to the universal ball support by the universal ball, an elastic contraction of a fine displacement portion is achieved by the elastic reed, and the elastic reed is connected with a center of the substrate-carrying stage support surface through the flange adapter, so as to achieve a stable Z-direction fine displacement motion of the vacuum substrate-carrying stage mechanism.

* * * * *